(12) United States Patent
Singh et al.

(10) Patent No.: US 11,164,978 B2
(45) Date of Patent: Nov. 2, 2021

(54) HIGH-VOLTAGE DIODE FINFET PLATFORM DESIGNS

(71) Applicant: GLOBALFOUNDRIES U.S. Inc., Malta, NY (US)

(72) Inventors: Jagar Singh, Clifton Park, NY (US); Sudarshan Narayanan, Framingham, MA (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 75 days.

(21) Appl. No.: 16/774,482

(22) Filed: Jan. 28, 2020

(65) Prior Publication Data
US 2021/0234052 A1   Jul. 29, 2021

(51) Int. Cl.
*H01L 29/861* (2006.01)
*H01L 27/08* (2006.01)
*H01L 29/06* (2006.01)
*H01L 29/08* (2006.01)

(52) U.S. Cl.
CPC ...... *H01L 29/8613* (2013.01); *H01L 27/0814* (2013.01); *H01L 29/0649* (2013.01); *H01L 29/08* (2013.01)

(58) Field of Classification Search
CPC . H01L 27/0814; H01L 29/0649; H01L 29/08; H01L 29/8613; H01L 27/0262; H01L 29/1004; H01L 29/0804; H01L 29/0821; H01L 29/0692; H01L 29/732; H01L 29/66272; H01L 27/1203; H01L 29/36; H01L 29/0273; H01L 29/0623; H01L 29/082; H01L 27/0248; H01L 27/082; H01L 29/669; H01L 29/063;
(Continued)

(56) References Cited

U.S. PATENT DOCUMENTS 8,664,720 B2   3/2014   Shrivastava et al.
8,928,083 B2   1/2015   Chang et al.
9,202,760 B2   12/2015  Domanski
(Continued)

OTHER PUBLICATIONS

Singh et al., "Analog, RF, and ESD Device Challenges and Solutions for 14nm FinFET Technology and Beyond," IEEE, Symposium on VLSI Technology (VLSI-Technology): Digest of Technical Papers, 2014, pp. 1-2.
(Continued)

*Primary Examiner* — Mouloucoulaye Inoussa
(74) *Attorney, Agent, or Firm* — Gibb & Riley, LLC; Anthony J. Canale

(57) ABSTRACT

A device includes a substrate having a top surface and a bottom surface. A first doping well having a first part and a second part is located in the substrate. An undoped moat is in the substrate between the first doping well and a second doping well. A diode includes an anode with an increased first doping concentration region in the first doping well and a cathode with an increased second doping concentration region in the second doping well. An isolation region is in the first doping well having a first portion proximate the top surface and a second portion distal to the top surface. A gap made of an undoped region is in the first doping well between the first part and the second part. The gap is located between the distal portion of the isolation region and the bottom surface of the substrate.

20 Claims, 7 Drawing Sheets

(58) Field of Classification Search
CPC ............. H01L 29/1095; H01L 21/8232; H01L 21/26513; H01L 23/60; H01L 27/0629
USPC ....... 257/343, 173, 355, 339, 262, 334, 335, 257/565, 272; 438/286, 133, 420, 196, 438/234, 270, 194
See application file for complete search history.

(56) References Cited

U.S. PATENT DOCUMENTS

| | | | |
|---|---|---|---|
| 9,673,189 B2 | 6/2017 | Huang et al. | |
| 2006/0261408 A1* | 11/2006 | Khemka | H01L 29/7835 257/335 |
| 2006/0273428 A1* | 12/2006 | Khemka | H01L 29/66325 257/565 |
| 2010/0155776 A1 | 6/2010 | Lee | |
| 2011/0241083 A1* | 10/2011 | Khemka | H01L 29/1083 257/262 |
| 2013/0285208 A1 | 10/2013 | Standaert et al. | |
| 2015/0380398 A1* | 12/2015 | Mallikarjunaswamy | H01L 29/0878 257/272 |
| 2016/0020203 A1 | 1/2016 | Zhang et al. | |
| 2016/0300828 A1* | 10/2016 | Laine | H01L 29/1095 |
| 2017/0098644 A1* | 4/2017 | Hong | H01L 27/0262 |
| 2019/0103396 A1* | 4/2019 | Zhan | H01L 29/36 |

OTHER PUBLICATIONS

Lin et al., "Design Optimization of a Breakdown Silicon Controlled Rectifier (BDSCR) for Cell Phone Antenna Switch Pin Electrostatic Discharge (ESD) Protection," IEEE, 40th Electronic Overstress/ Electrostatic Discharge Symposium (EOS/ESD), 2018, pp. 1-8.

* cited by examiner

HIGH-VOLTAGE DIODE FINFET PLATFORM DESIGNS

BACKGROUND

Field of the Invention

The present invention relates generally to semiconductor devices, and more particularly to high-voltage semiconductor devices, such as diodes for use in high-voltage integrated circuit designs, and methods of forming such devices.

Description of Related Art

Semiconductor devices are used in a large number of electronic devices, such as computers, cell phones, and others. Semiconductor devices include integrated circuits that may be formed on semiconductor wafers by depositing many types of thin films of material over the semiconductor wafers and patterning the thin films of material to form the integrated circuits (ICs).

One of the goals of the semiconductor industry is to continue shrinking the size while increasing the speed of individual devices. To achieve these goals, planar devices and non-planar devices may be used. Advancing technology continues to make smaller structures; however, as IC components get smaller, the risk of small or misaligned electrical connections gives rise to high contact resistance or open circuits. In design and fabrication of smaller and smaller IC components there is an ongoing struggle between performance and reliability. That is, reliability typically requires thick dielectric barriers while performance requires the thinnest barrier possible.

Integrated circuit design decisions are often driven by device scalability, device density, manufacturing efficiency and costs. For example, size scaling of planar field effect transistors (FETs) resulted in the development of planar FETs with relatively short channel lengths and, consequently, the smaller channel lengths resulted in a corresponding increase in short channel effects. Non-transistor elements, such as capacitors and diodes, are important elements in semiconductor technology. Much research has been done regarding planar diode and capacitor device structures. The use of non-planar devices in advancing technologies is becoming increasingly more pervasive.

Integrated circuit devices can be formed as semiconductor-on-insulator structures or as bulk structures. In the case of bulk structures, ground plane doping in the form of a well regions may be used in the bulk semiconductor substrate below the device to prevent leakage, which can negatively impact device operational characteristics. Specifically, doped well regions in a bulk semiconductor substrate below the device can be used to prevent direct current flow from the source region to the drain region by creating diode junctions between the source region and ground plane and between the drain region and the ground plane. Unfortunately, as device sizes continue to be scaled, ground plane doping in the bulk semiconductor substrate may not be sufficient for preventing such through-substrate leakage. Accordingly, what is needed in the art are high-voltage devices that are compatible with non-traditional device architectures and design space while at the same time overcoming the deficiencies of the prior art.

SUMMARY

In view of the foregoing, disclosed herein is a semiconductor structure that includes a high-voltage diode using fins. In the structure, a semiconductor fin can be formed on a substrate. The semiconductor fin can be a first semiconductor material. Instead, the semiconductor fin can include alternating layers of a first semiconductor material and a second semiconductor material. The substrate can be doped to form a first doping well having a first type of doping and a second doping well having a second type of doping. The high-voltage diode can include a moat in the substrate between the first doping well and the second doping well. A deep doping well can be formed in the substrate directly beneath the first doping well. The first doping well can include a first part and a second part with a gap made of an undoped or lightly doped portion of the first doping well. Such features of the high-voltage diode can create a wider depletion width resulting in an increase in breakdown voltage for the device and structure.

More particularly, disclosed herein is a device structure. The device structure includes a substrate having a top surface and a bottom surface opposite the top surface. A first doping well is located in the substrate. The first doping well has a first part and a second part. A second doping well is located in the substrate. An undoped moat is located in the substrate between the first doping well and the second doping well. The device structure includes a diode having an anode with a relatively increased first doping concentration region in the first doping well and a cathode with a relatively increased second doping concentration region in the second doping well. An isolation region is located in the substrate. The isolation region is positioned in the first doping well wherein the isolation region has a first portion proximate to the top surface of the substrate and a second portion distal to the top surface of the substrate. A gap is in the first doping well between the first part and the second part. The gap is made of an undoped region in the first doping well, wherein the gap is located between the distal portion of the isolation region and the bottom surface of the substrate.

Also disclosed herein is a diode structure that includes a substrate. A first doping well is in the substrate. The first doping well has a first part and a second part. A second doping well is in the substrate. The second doping well includes a different doping type than the first doping well. An undoped moat is in the substrate between the first doping well and the second doping well. An isolation region is in the substrate. The isolation region is positioned in the first doping well and extends to a surface of the substrate, wherein the isolation region has a first portion proximate to the surface of the substrate and a second portion distal to the surface of the substrate. An undoped gap is located in the first doping well, between the first part and the second part. The undoped gap is positioned between the second portion of the isolation region and a bottom of the substrate. The bottom of the substrate is opposite the surface of the substrate. An anode having a relatively increased first doping concentration region is in the first doping well. A cathode having a relatively increased second doping concentration region is in the second doping well.

Also disclosed herein are device structures. Each device structure can include a substrate having a top surface and a bottom surface opposite the top surface. A first doping well is in the substrate and has a top coplanar with the top surface of the substrate and a bottom opposite the top, wherein the first doping well includes a first type of doping. Fins extend from the top of the first doping well, wherein the fins have a first fin portion proximate to the substrate and a second fin portion distal to the substrate. An anode includes a relatively increased first doping concentration region in the first doping well. An isolation region is in the first doping well. The isolation region has a first portion proximate to the top surface of the substrate and a second portion distal to the top surface of the substrate. A gap is in the first doping well. The gap defines an undoped region between a first part of the first doping well and a second part of the first doping well. A deep doping well is in the substrate. The deep doping well is attached to the first doping well and includes the first type of doping. The deep doping well is located between the bottom of the first doping well and the bottom surface of the substrate. A second doping well is in the substrate and has a top coplanar with the top surface of the substrate and a bottom opposite the top, wherein the second doping well includes a second type of doping different from the first type of doping. An undoped moat is in the substrate between the first doping well and the second doping well. A cathode includes a relatively increased second doping concentration region in the second doping well.

BRIEF DESCRIPTION OF THE SEVERAL VIEWS OF THE DRAWINGS

The devices and methods will be better understood from the following detailed description with reference to the accompanying drawings, which are not necessarily drawn to scale and in which.

DETAILED DESCRIPTION

Figure 1:
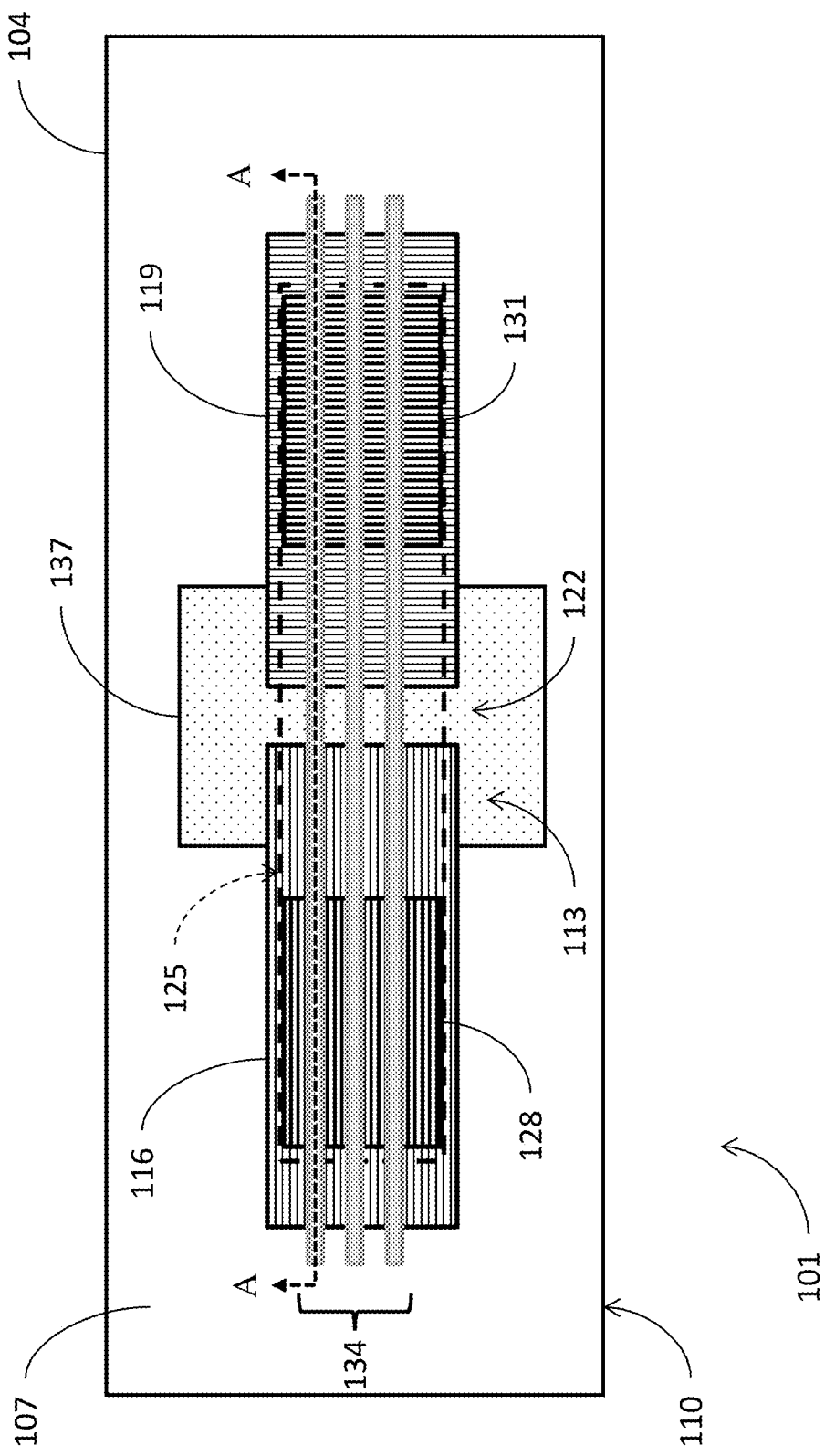
FIG. 1 is a top view of a high-voltage diode structure according to devices and methods herein.

The disclosure will now be described with reference to a high-voltage diode having an increase in breakdown voltage. While the disclosure will be described hereinafter in connection with specific devices and methods thereof, it will be understood that limiting the disclosure to such specific devices and methods is not intended. On the contrary, it is intended to cover all alternatives, modifications, and equivalents as may be included within the spirit and scope of the disclosure as defined by the appended claims.

For a general understanding of the features of the disclosure, reference is made to the drawings. The drawings are not to scale; however, in the drawings, like reference numerals have been used throughout to identify identical elements.

It will be readily understood that the devices and methods of the present disclosure, as generally described and illustrated in the drawings herein, may be arranged and designed in a wide variety of different configurations in addition to the devices and methods described herein. Thus, the following detailed description of the devices and methods, as represented in the drawings, is not intended to limit the scope defined by the appended claims but is merely representative of selected devices and methods. The following description is intended only by way of example, and simply illustrates certain concepts of the devices and methods, as disclosed and claimed herein.

The fabrication of integrated circuits (ICs) typically involves the formation of features on a substrate that make up circuit components, such as transistors, resistors, capacitors, and diodes, and the interconnection of such components. To form the features, layers can be repeatedly deposited on the substrate and patterned as desired. A plurality of ICs may be formed on a semiconductor substrate, such as a silicon wafer, in parallel.

During fabrication, a substrate or wafer may be processed through numerous procedures to create semiconductor devices. One such procedure may be doping of the substrate followed by appropriate thermal processing. The substrate experiences thermal processing in order to activate dopant atoms implanted in regions of the substrate, for example, source and drain regions for a transistor, with minimal dopant diffusion. The dopants may be used to designate the conductive characteristics of the wafer to either an N-type or P-type silicon.

Another such procedure is lithography, for example, photolithography. The substrate is processed using photolithography to transfer patterns or images for the circuit elements of the device onto a wafer using one or more masks.

Semiconductor device fabrication is typically a multiple step sequence of photolithographic and chemical processing steps during which electronic circuits are gradually created on the wafer made of semiconducting material. Etching may be used to remove layers from the surface of the wafer and to form trenches in the wafer during manufacturing. Etching, in conjunction with lithographic techniques, may be used to attack certain areas of the semiconductor surface in order to form recesses in the material or to otherwise remove portions of semiconductor layers. For many etching steps, part of the wafer is protected from the etchant by a masking material that resists etching.

For electronic applications, semiconducting substrates, such as silicon wafers, can be used. The substrate enables easy handling of the microdevice through the many fabrication steps. Often many individual devices are made together on one substrate and then singulated into separated devices toward the end of fabrication. In order to fabricate a microdevice, many processes may be performed, one after the other, often repeatedly. These processes typically include depositing a film, patterning the film with the desired micro features, and removing (or etching) portions of the film. For example, in memory chip fabrication, there may be several lithographic steps, oxidation steps, etching steps, doping steps, and many other steps performed. The complexity of microfabrication processes can be described by their mask count.

Optical lithography uses light against a photoresist. A photoresist is a light-sensitive material used to selectively expose a layer of material on a substrate. There are two types of photoresists. Positive photoresist, the most common type, becomes soluble in the basic developer when exposed; negative photoresist becomes insoluble in the developer. This chemical change allows some of the photoresist to be removed by a special solution, called "developer" by analogy with photographic developer. In other words, a positive resist is a type of photoresist in which the portion of the photoresist that is exposed to light becomes soluble to the photoresist developer. The portion of the photoresist that is unexposed remains insoluble to the photoresist developer. A negative resist is a type of photoresist in which the portion of the photoresist that is exposed to light becomes insoluble to the photoresist developer. The photoresist developer dissolves the unexposed portion of the photoresist.

Semiconductor devices are sometimes formed in wells, for example N-type wells and/or P-type wells formed in substrates, which provides a degree of insulation from the substrate. Those skilled in the art will recognize that different dopants can be used to achieve the different conductivity types for the N-type wells and/or P-type wells and that the dopants may vary depending upon the different semiconductor materials used. For example, a silicon-based semiconductor material (e.g., silicon, silicon germanium, etc.) having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). (However, note that the groups for Group III and Group V dopants refer to table groups on the periodic table of elements.) Alternatively, a gallium nitride (GaN)-based semiconductor material having P-type conductivity is typically doped with magnesium (Mg), whereas a gallium nitride (GaN)-based semiconductor material having N-type conductivity is typically doped with silicon (Si). Those skilled in the art will also recognize that different conductivity levels will depend upon the relative concentration levels of the dopants.

The well and the substrate form a PN-junction. Current P+/N-well or N+/P-well diodes are designed for operation at a voltage below approximately 5 volts. However, in some cases voltages may be applied to the thus formed device, to the well, or to the substrate, which may cause a breakdown of the PN-junction, which in turn may lead to a high breakdown current flowing. Such a current may lead to damage of the device. For example, breakdown voltage may occur at approximately 8 volts, due to current leakage.

Besides high performance devices, which are typically low voltage circuits, other high-voltage devices may be essential for some technologies. Examples of high-voltage devices include input/output devices. High-voltage devices are traditionally produced using a thicker gate oxide, longer channel length, changing the doping etc. Nevertheless, such options are not feasible in non-planar device technologies which require fixed design space to minimize process variations and reduce process complexities. According to devices and methods herein, a high-voltage device can have breakdown voltages greater than approximately 40 volts.

Advantageously, the methods disclosed herein may improve the functioning of the electrical circuits by improving the breakdown voltage at the PN junction by dropping additional voltage along the path of current flow in order to provide a high voltage junction that can support high voltage operation. In addition, the methods disclosed herein may remove the need for rework, which may, for example, reduce device costs, shorten cycle time, and improve device yield.

In view of the foregoing, disclosed herein are device structures. Each device structure can include a substrate having a top surface and a bottom surface opposite the top surface. According to devices and methods herein, the substrate can be made of a semiconductor material. A first doping well is in the substrate and has a top coplanar with the top surface of the substrate and a bottom opposite the top, wherein the first doping well includes a first type of doping. Fins extend from the top of the first doping well, wherein the fins have a first fin portion proximate to the substrate and a second fin portion distal to the substrate. An anode includes a relatively increased first doping concentration region in the first doping well. An isolation region is in the first doping well. The isolation region has a first portion proximate to the top surface of the substrate and a second portion distal to the top surface of the substrate. A gap is in the first doping well. The gap defines an undoped region between a first part of the first doping well and a second part of the first doping well. Those skilled in the art will recognize that the undoped region can be a section of semiconductor material that does not contain an impurity for the purpose of increasing conductivity in the semiconductor material. A deep doping well is in the substrate. The deep doping well is attached to the first doping well and includes the first type of doping. The deep doping well is located between the bottom of the first doping well and the bottom surface of the substrate. A second doping well is in the substrate and has a top coplanar with the top surface of the substrate and a bottom opposite the top, wherein the second doping well includes a second type of doping different from the first type of doping. An undoped moat is in the substrate between the first doping well and the second doping well. A cathode includes a relatively increased second doping concentration region in the second doping well.

Now, referring to the drawings, FIG. 1 shows a top view of a structure of an exemplary active device, indicated generally as 101. Such an active device can include resistors, inductors, capacitors, diodes, and other components that operate in an integrated circuit. The active device 101 may be formed in a substrate 104. The substrate 104 may be any conventional semiconductor substrate such as, for example, a bulk silicon substrate or an active layer of semiconductor material of a silicon-on-insulator (SOI). The substrate 104 has a top surface 107 and a bottom surface 110. In an exemplary embodiment, the active device 101 may be a diode, indicated generally as 113. According to devices and methods herein, the diode may constitute a high voltage diode. The diode 113 may have a first doping well 116 located in the substrate 104. The diode 113 may also have a second doping well 119 located in the substrate 104. A moat 122 may be located in the substrate 104 between the first doping well 116 and the second doping well 119. The moat 122 is an undoped region of the substrate 104 between the first doping well 116 and the second doping well 119. The diode 113 has an active area 125 defined by the broken line in FIG. 1. The active area of the device is the region in which electrical connections to other circuit components can be made. The active area 125 includes an anode 128 with a relatively increased first doping concentration region in the first doping well 116 and a cathode 131 with a relatively increased second doping concentration region in the second doping well 119. The structure may include one or more fins 134. The fins 134 may include a polysilicon conductor 137, such as a gate or dummy gate.

Figure 2:
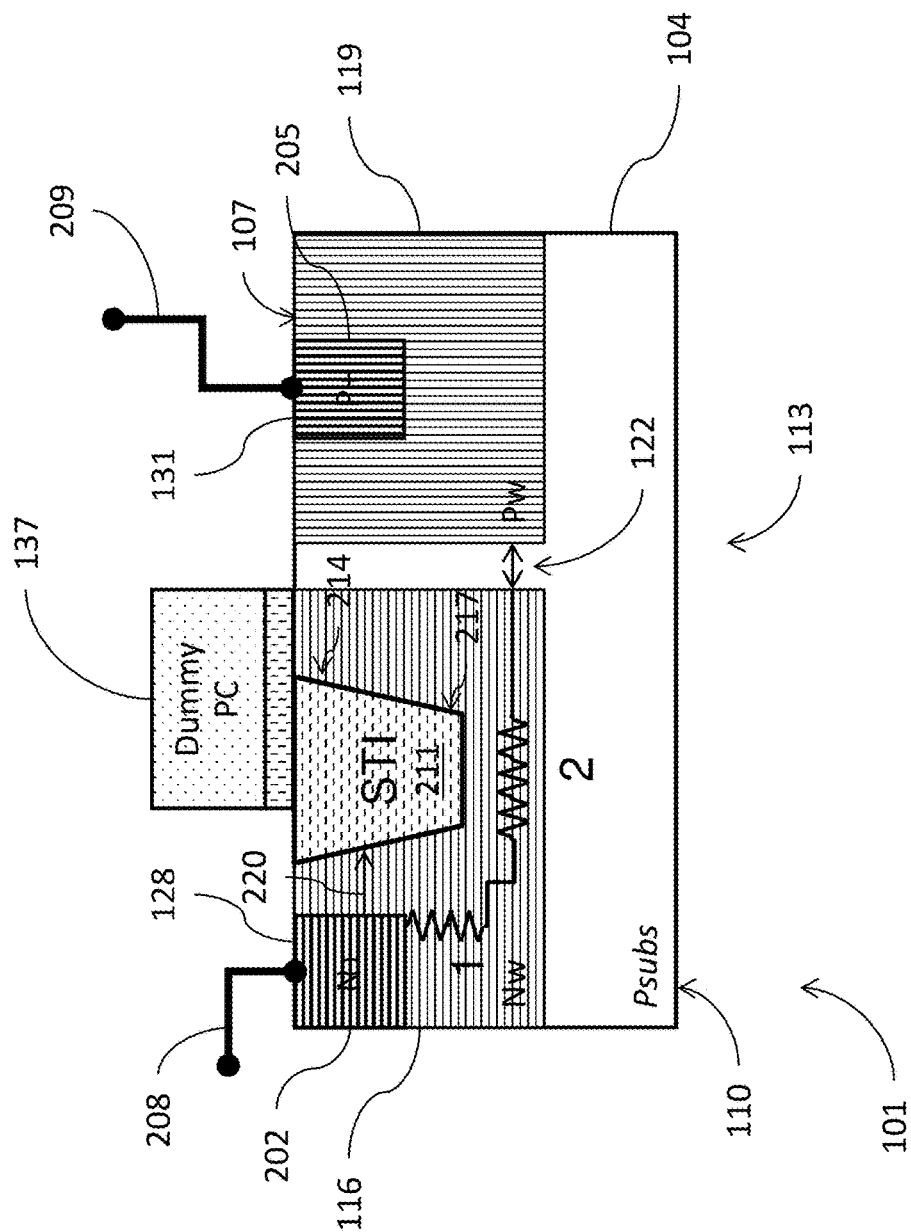
FIG. 2 is an exemplary cross-section illustration taken along line A-A of FIG. 1, showing a high-voltage diode structure according to devices and methods herein.

FIG. 2 shows an exemplary cross-section illustration, such as one taken along line A-A of FIG. 1, showing a high-voltage diode structure according to devices and methods herein. The diode 113 can be formed in the substrate 104, which substrate 104 may be the kind usable for fabricating semiconductor devices. The diode 113 may have a first doping well 116 located in the substrate 104 and a second doping well 119 located in the substrate 104. The semiconductor can be formed of silicon and later doped with an impurity or can be deposited/grown to include semiconductor doping in situ. A moat 122 may be located in the substrate 104 between the first doping well 116 and the second doping well 119. The moat 122 is an undoped region of the substrate 104 between the first doping well 116 and the second doping well 119 that allows lateral implant diffusion and wider depletion width in the substrate 104. The polysilicon conductor 137 may be located anywhere on the substrate 104. For example, the polysilicon conductor 137 may be centered over the first doping well 116 and the second doping well 119, as shown in FIG. 1 or, as shown in FIG. 2, may be completely over the first doping well 116.

As shown in FIG. 2, in the first doping well 116, a first region 202 can have a relatively increased first doping concentration to define the anode 128 of the diode 113. In the second doping well 119, a second region 205 can have a relatively increased second doping concentration region to define the cathode 131 of the diode 113. Each of the anode 128 and the cathode 131 can have contacts for conductive lines 208, 209, respectively, so that the diode 113 can be electrically connected (e.g., by a local interconnect or by contacts and wiring) between various structures. The conductive lines 208, 209 can be, for example, tungsten (W), cobalt (Co), or ruthenium (Ru), although other metals, such as copper (Cu), aluminum (Al), or Titanium (Ti), can be used. It is also contemplated that alloys and nitrides, such as titanium nitride (TiN), of such metals can be used.

In other words, the structure can include a semiconductor substrate and an N-well and a P-well in the semiconductor substrate. The structure can further include a first anode and, particularly, an N+-doped region in the N-well of the semiconductor substrate. In addition, the structure can further include a first cathode and, particularly, a P+-doped region in the P-well of the semiconductor substrate. In some configurations, the N+-doped region and/or the P+-doped region can be appropriately doped epitaxial semiconductor material. In any case, the diode can include an N-doped region in the N-well of the semiconductor substrate positioned laterally immediately adjacent to the first anode and a P-doped region in the P-well of the semiconductor substrate. Those skilled in the art will recognize that different dopants can be used to achieve the different conductivity types and that the dopants may vary depending upon the different semiconductor materials used. For example, a silicon-based semiconductor material (e.g., silicon, silicon germanium, etc.) having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Note that the groups for Group III and Group V dopants refer to table groups on the periodic table of elements. Alternatively, a gallium nitride (GaN)-based semiconductor material having P-type conductivity is typically doped with magnesium (Mg), whereas a gallium nitride (GaN)-based semiconductor material having N-type conductivity is typically doped with silicon (Si). Those skilled in the art will also recognize that different conductivity levels will depend upon the relative concentration levels of the dopants.

To form such higher concentration doped regions, a series of masked recess etch and in situ-doped epitaxial semiconductor deposition processes can be performed. For example, a first mask can be formed so as to have openings that are aligned over the first doping well (N-well) 116. An etch process (e.g., a selective anisotropic etch process) can then be performed in order to etch exposed portions of the semiconductor substrate and, thereby form in first doping well (N-well) 116 a first recess. N-doped epitaxial semiconductor material (e.g., N+ epitaxial silicon) can then be deposited so as to fill the recess, thereby forming in the first doping well (N-well) 116 the anode 128. The first mask can then be removed, and a second mask can be formed so as to have openings that are aligned over the second doping well (P-well) 119. An etch process (e.g., a selective anisotropic etch process) can then be performed in order to etch exposed portions of the semiconductor substrate and, thereby form in the second doping well (P-well) 119 a second recess. P-doped epitaxial semiconductor material (e.g., P+ epitaxial silicon) can then be deposited so as to fill the recess, thereby forming in the second doping well (P-well) 119 the cathode 131.

In a similar fashion, the moat 122 between the first doping well 116 (N-well) and the second doping well 119 (P-well) can be formed by appropriate masking.

An isolation region 211 can be located in the substrate 104. The isolation region 211, which can be a shallow trench isolation (STI) region, may be positioned in the first doping well 116 wherein the isolation region 211 has a first portion 214 proximate to the top surface 107 of the substrate 104 and a second portion 217 distal to the top surface 107 of the substrate 104. The isolation region 211 blocks direct voltage from the anode 128, as represented by arrow 220 in FIG. 2. Additionally, the isolation region 211 blocks the high voltage directly interacting between the anode to cathode. According to devices and methods herein, junction breakdown voltage can be improved by dropping additional voltage along the path of current flow represented by resistors 1 and 2 in FIG. 2.

Figure 3:
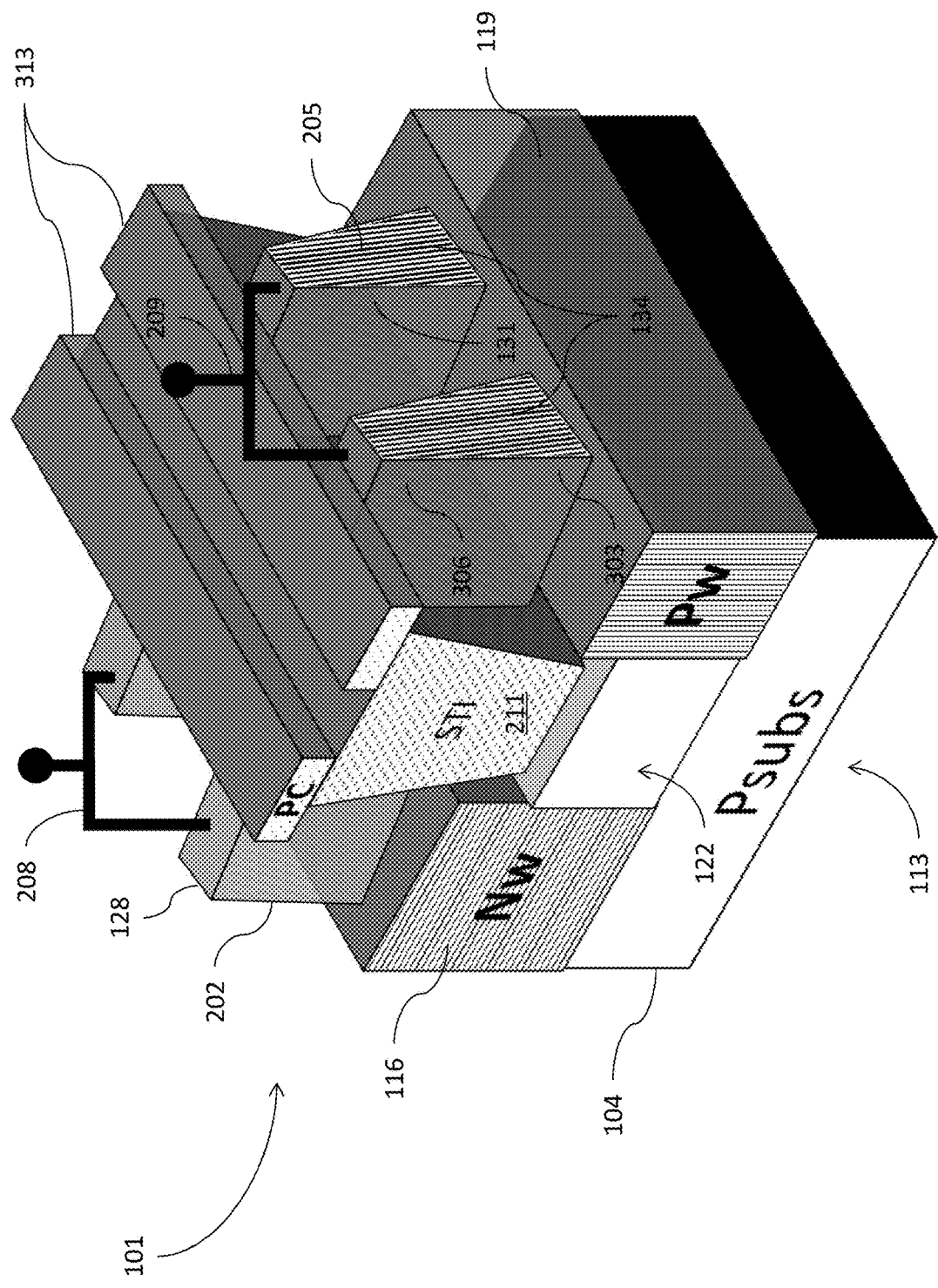
FIG. 3 is a three-dimensional (3D) illustration of a high-voltage diode structure according to devices and methods herein.

Referring to FIG. 3, fins 134, for example, semiconductor fins for P-type and N-type field effect transistors (FETs) can be concurrently formed on the semiconductor substrate 104. For purposes of this disclosure, a fin 134 is a relatively tall, thin, essentially rectangular-shaped semiconductor body. The fins 134 can have a first fin portion 303 proximate to the substrate 104 and a second fin portion 306 distal to the substrate 104. Techniques for forming semiconductor fins (e.g., lithographic patterning and etch techniques, sidewall image transfer techniques, etc.) are well known in the art and, thus, the details of such techniques have been omitted from this specification in order to allow the reader to focus on the salient aspects of the disclosed methods. The perspective view in FIG. 3 shows the physical relationship between the fins 134 and the first doping well 116 (N-well) and the second doping well 119 (P-well) with the moat 122 therebetween. The isolation region 211 (STI) can cut through the fins 134 to provide separation and block the high voltage directly interacting between the anode 128 and cathode 131. Additional processing can include, but is not limited to, forming a structure, such as a polysilicon conductor 313 transverse to fins 134; forming additional active devices on the fins 134; and forming electrical connections, such as conductive lines 208, 209.

Figure 4:
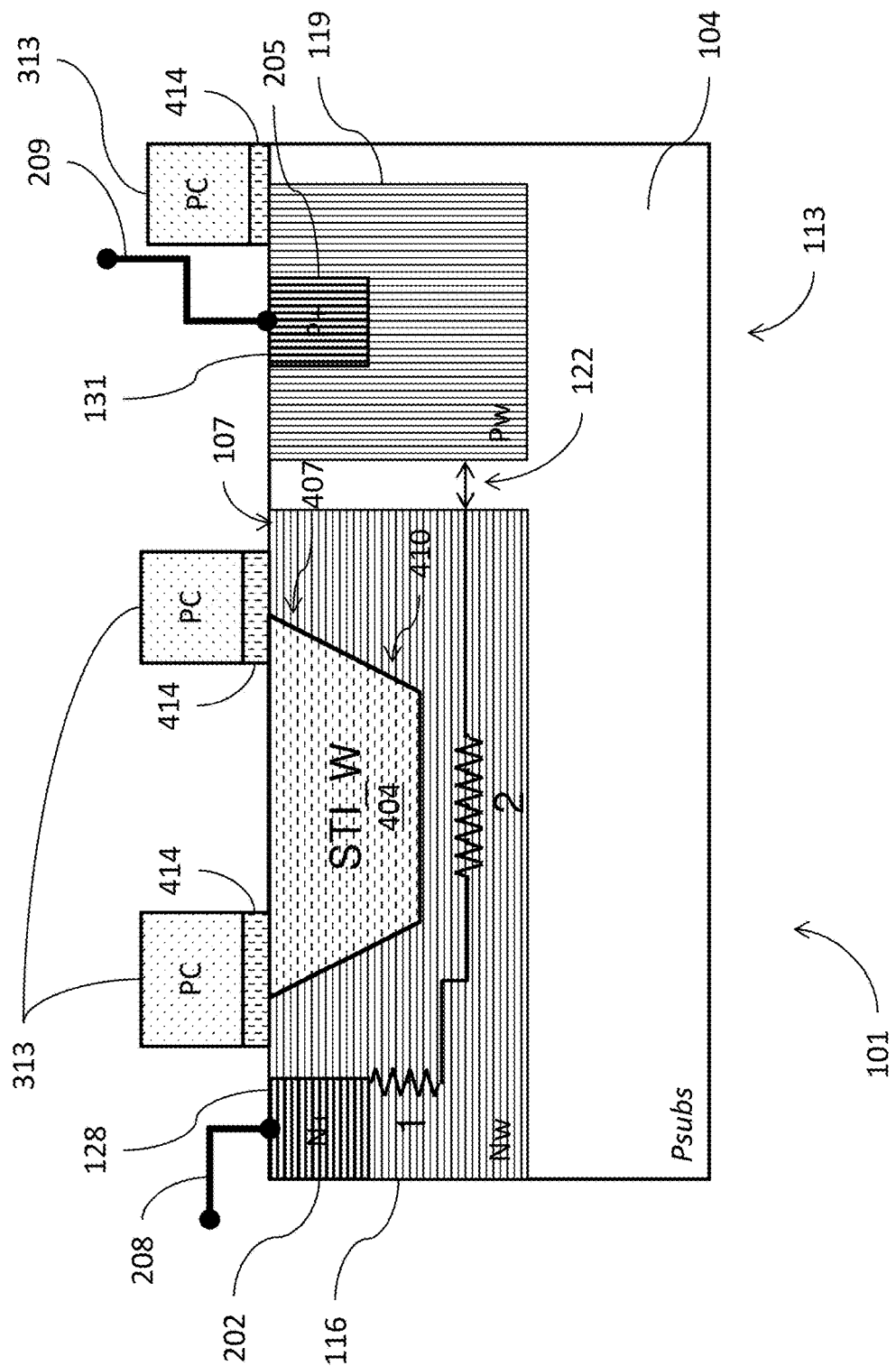
FIG. 4 is a cross-section illustration of a high-voltage diode structure according to devices and methods herein.

FIG. 4 illustrates a further enhancement according to devices and methods herein. As shown in FIG. 4, a wide isolation region 404 can be located in the substrate 104. The wide isolation region 404 may be positioned in the first doping well 116 wherein the wide isolation region 404 has a first portion 407 proximate to the top surface 107 of the substrate 104 and a second portion 410 distal to the top surface 107 of the substrate 104. As the width of the wide isolation region 404 increases, the resistance to electrical flow through the first doping well 116 also increases, as represented by resistor 1 and particularly resistor 2 in FIG. 4. This serves to increase the breakdown voltage of the PN junction. The breakdown voltage of the PN junction will continue to increase until it reaches the breakdown voltage for the interface between the first doping well 116 and the substrate 104.

Further, as shown in FIG. 4, a dielectric layer 414 can be formed in contact with the top surface 107 of the substrate 104. The dielectric layer 414 can be, for example, silicon oxide, a nitride, or any other suitable dielectric material (e.g., borophosphosilicate glass (BPSG), tetraethyl orthosilicate (TEOS), fluorinated tetraethyl orthosilicate (FTEOS), etc.). The dielectric layer 414 may be formed using an appropriate layer deposition technique, such as atomic layer deposition (ALD), chemical vapor deposition (CVD), physical vapor deposition (PVD), spin-on deposition (SOD), or any other technique known in the art. The polysilicon conductor 313 can be formed on the dielectric layer 414.

Figure 5:
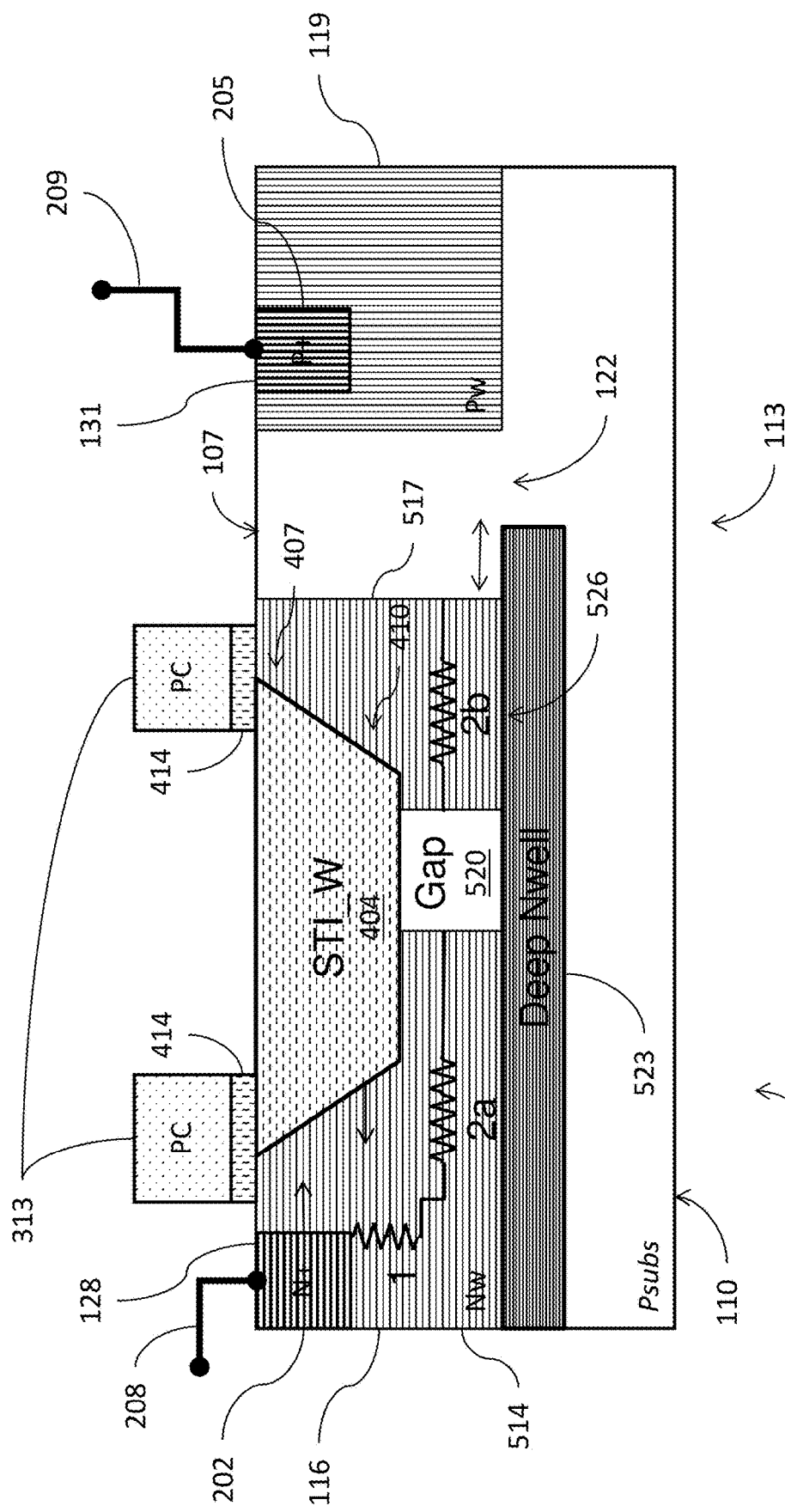
FIG. 5 is a cross-section illustration of a high-voltage diode structure according to devices and methods herein.

FIG. 5 illustrates additional enhancements to the high-voltage diode. The diode 113 may have a first doping well 116 located in the substrate 104 and a second doping well 119 located in the substrate 104. A moat 122 may be located in the substrate 104 between the first doping well 116 and the second doping well 119. The moat 122 is an undoped region of the substrate 104 between the first doping well 116 and the second doping well 119 that allows lateral implant diffusion and wider depletion width in the substrate 104. The first doping well 116 can include a first region 202 having a relatively increased first doping concentration to define the anode 128 of the diode 113. The second doping well 119 can include a second region 205 having a relatively increased second doping concentration region to define the cathode 131 of the diode 113. Each of the anode 128 and the cathode 131 can have a conductive line 208, 209, respectively, so that the diode 113 can be electrically connected (e.g., by a local interconnect or by contacts and wiring) between various structures.

A wide isolation region 404 can be located in the substrate 104. The wide isolation region 404 may be positioned in the first doping well 116 wherein the wide isolation region 404 has a first portion 407 proximate to the top surface 107 of the substrate 104 and a second portion 410 distal to the top surface 107 of the substrate 104. As shown in FIG. 5, the first doping well 116 can have a first part 514 and a second part 517 with a gap 520 in the first doping well between the first part 514 and the second part 517, such that adjacent parts are physically separated. The gap 520 can be made of an undoped or a lightly doped region in the first doping well 116, wherein the gap 520 is located between the distal portion 511 of the isolation region 505 and the bottom surface 510 of the substrate 104. As used herein, the gap 520 refers to an undoped or lightly doped region separating regions having the same doping type, while the moat 122 refers to an undoped region of the substrate 104 that separates regions having different doping types. The gap 520 increases the resistance to electrical flow through the first doping well, as represented by resistor 1 and particularly resistors 2a and 2b in FIG. 5. The gap 520 creates a higher resistance in a smaller area and serves to increase the breakdown voltage of the PN junction.

The diode 113 shown in FIG. 5 can also include a third doping well, such as deep doping well 523, in the substrate 104. The deep doping well 523 can be attached to the first doping well 116 and have the first type of doping. The deep doping well 523 can be located between the bottom 526 of the first doping well 116 and the bottom surface 110 of the substrate 104. The deep doping well 523 under the first doping well 116 enhances the breakdown voltage of the first doping well 116 and the substrate 104. The deep doping well 523 may extend into the moat 122 to increase the PN junction area of the diode 113.

Figure 6:
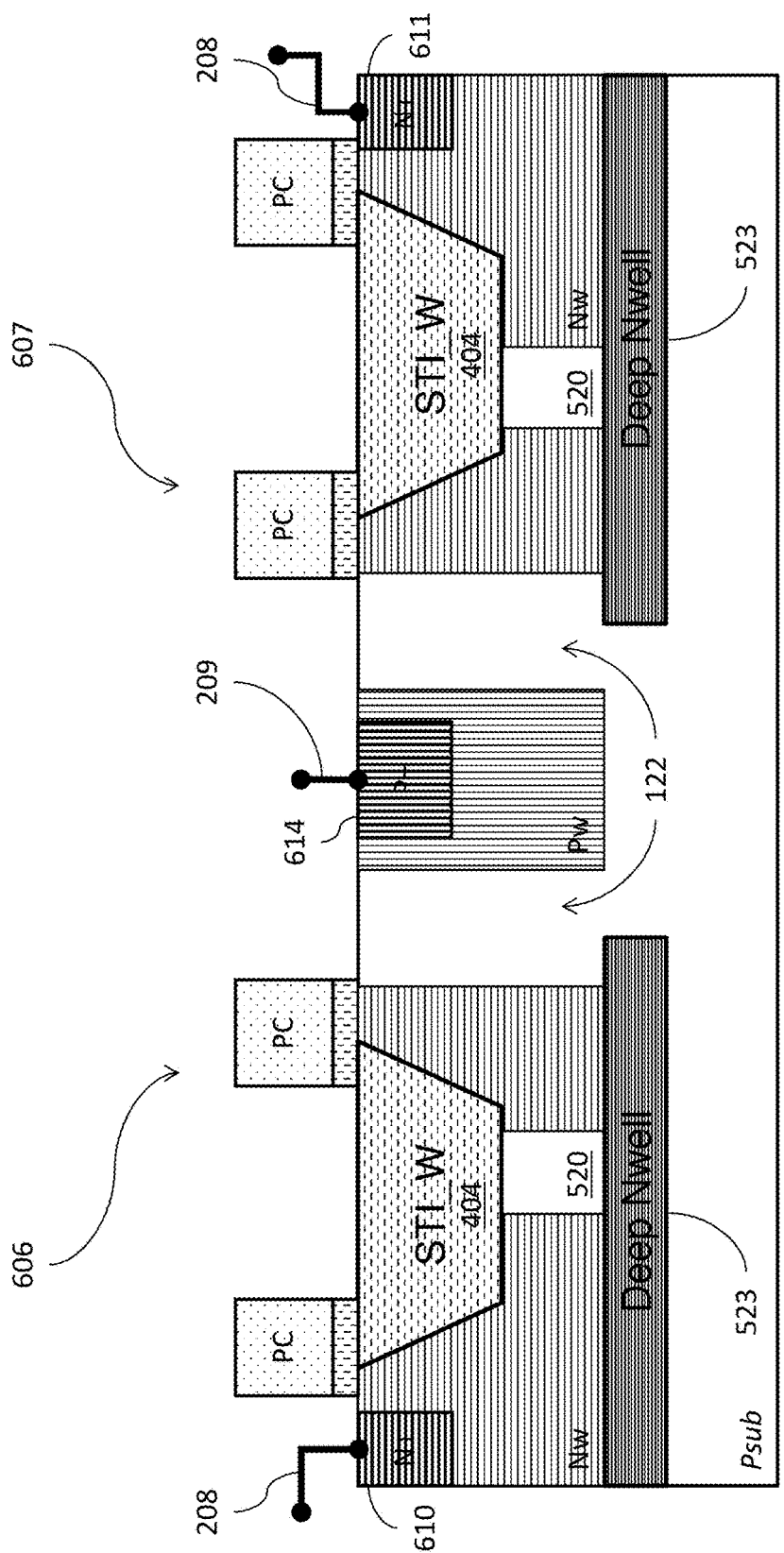
FIG. 6 is a cross-section illustration of a structure having symmetric high-voltage diodes according to devices and methods herein.

FIG. 6 shows diodes 606, 607 arranged as a symmetric pair according to devices and methods herein. The diodes 606, 607 have separate anodes 610, 611 and a common cathode 614. Each of the diodes 606, 607 has a first doping well (N-well) 116 with a first type of doping. The first doping well (N-well) 116 has a first part 514 and a second part 517, with a gap 520 in the first doping well (N-well) 116 between the first part 514 and the second part 517. The gap 520 can be made of an undoped or a lightly doped region in the first doping well (N-well) 116. A single second doping well (P-well) 119 with a second type of doping, different from the first type of doping, is between each of the first doping well (N-well) 116 for each of the diodes 606, 607. A moat 122 is located between the first doping well (N-well) 116 for the first diode 606 and the second doping well (P-well) 119 and between the first doping well (N-well) 116 for the second diode 607 and the second doping well (P-well) 119. Each of the diodes 606, 607 has a wide isolation (STI_W) region 404 positioned in the first doping well (N-well) 116, such that the gap 520 is located beneath the wide isolation (STI_W) region 404. Further, each of the diodes 606, 607 has a deep doping well (Deep N-well) 523 attached to the first doping well (N-well) 116. The deep doping well (Deep N-well) 523 has the same first type of doping. The deep doping well (Deep N-well) 523 can be located between the bottom of the first doping well (N-well) 116 and the bottom of the substrate 104. The deep doping well (Deep N-well) 523 for the first diode 606 extends into the moat 122 between the first doping well (N-well) 116 for the first diode 606 and the second doping well (P-well) 119. The deep doping well (Deep N-well) 523 for the second diode 607 extends into the moat 122 between the first doping well (N-well) 116 for the second diode 607 and the second doping well (P-well) 119.

Figure 7:
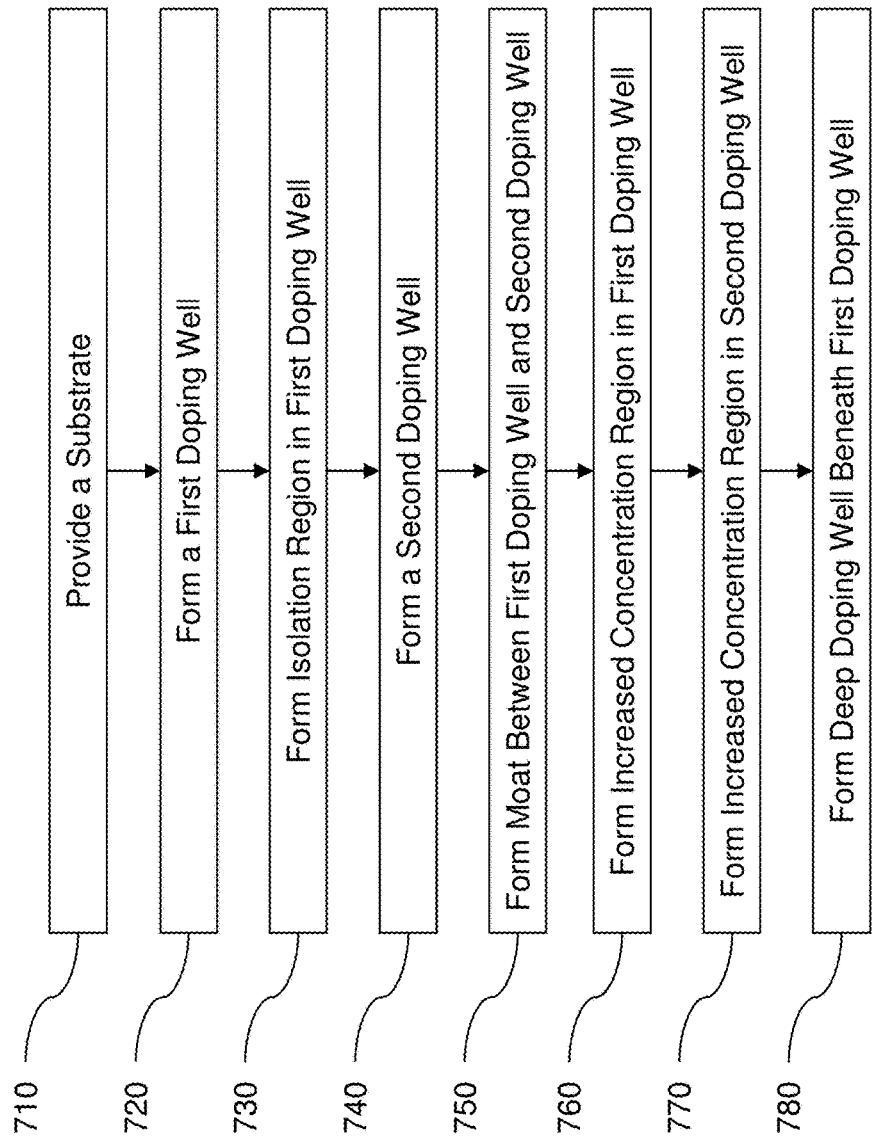
FIG. 7 is a flow diagram illustrating methods herein.

FIG. 7 is a flow diagram illustrating a processing flow of an exemplary method to form a high-voltage diode, such as described above. At 710, a substrate is provided (e.g., a bulk silicon substrate or any other suitable semiconductor substrate). The substrate has a top surface and a bottom surface. A first doping well (N-well) is formed adjacent the top surface of the substrate, at 720. The first doping well (N-well) can have a first part and a second part with an undoped or lightly doped gap between the first part and the second part. At 730, an isolation region is formed in the first doping well (N-well). To form the isolation region, a first etching process may be performed, forming a trench into the first doping well (N-well). The trench can be filled with a non-conductive, isolation material. At 740, a second doping well (P-well) is formed adjacent the top surface of the substrate. At 750, a moat is formed between the first doping well (N-well) and the second doping well (P-well). At 760, a relatively increased first doping concentration is formed in the first doping well (N-well) to define an anode. At 770, a relatively increased second doping concentration is formed in the second doping well (P-well) to define a cathode. At 780, a deep doping well (Deep N-well) is formed beneath the first doping well (N-well).

The methods as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections and buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For electronic applications, semiconducting substrates, such as silicon wafers, can be used. The substrate enables easy handling of the micro device through the many fabrication steps. Often, many individual devices are made together on one substrate and then singulated into separated devices toward the end of fabrication. In order to fabricate a microdevice, many processes are performed, one after the other, many times repeatedly. These processes typically include depositing a film, patterning the film with the desired micro features, and removing (or etching) portions of the film. For example, in memory chip fabrication, there may be several lithography steps, oxidation steps, etching steps, doping steps, and many others are performed. The complexity of microfabrication processes can be described by their mask count.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

The terminology used herein is for the purpose of describing particular devices and methods only and is not intended to be limiting of this disclosure. As used herein, the singular forms "a", "an", and "the" are intended to include the plural forms as well, unless the context clearly indicates otherwise. It will be further understood that the terms "comprises", "comprising", "includes", and/or "including", when used in this specification, specify the presence of stated features, integers, steps, operations, elements, and/or components, but do not preclude the presence or addition of one or more other features, integers, steps, operations, elements, components, and/or groups thereof.

Furthermore, terms such as "right", "left", "vertical", "horizontal", "top", "bottom", "upper", "lower", "under", "below", "underlying", "over", "overlying", "parallel", "perpendicular", etc., used herein are intended to describe relative locations as they are oriented and illustrated in the drawings (unless otherwise indicated). Terms such as "touching", "on", "in direct contact", "abutting", "directly adjacent to", "immediately adjacent to", etc., are intended to mean that at least one element physically contacts another element (without other elements separating the described elements).

The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The corresponding structures, materials, acts, and equivalents of all means or step plus function elements in the claims below are intended to include any structure, material, or act for performing the function in combination with other claimed elements as specifically claimed. The descriptions of the various devices and methods herein have been presented for purposes of illustration but are not intended to be exhaustive or limited to the devices and methods disclosed. Many modifications and variations will be apparent to those of ordinary skill in the art without departing from the scope and spirit of the described devices and methods. The terminology used herein was chosen to best explain the principles of the devices and methods, the practical application or technical improvement over technologies found in the marketplace, or to enable others of ordinary skill in the art to understand the devices and methods disclosed herein.

While various examples are described herein, it will be appreciated from the specification that various combinations of elements, variations, or improvements therein may be made by those skilled in the art and are within the scope of the disclosure. In addition, many modifications may be made to adapt a particular situation or material to the teachings of the disclosed concepts without departing from the essential scope thereof. Therefore, it is intended that the concepts not be limited to the particular examples disclosed as the best mode contemplated for carrying out the devices and methods herein, but that the devices and methods will include all features falling within the scope of the appended claims.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure comprising:
   a substrate having a top surface and a bottom surface opposite the top surface;
   a first doping well in the substrate;
   a second doping well in the substrate;
   an undoped moat in the substrate, the undoped moat being between the first doping well and the second doping well;
   a diode comprising an anode comprising a relatively increased first doping concentration region in the first doping well and a cathode comprising a relatively increased second doping concentration region in the second doping well;
   an isolation region in the substrate, the isolation region being positioned in the first doping well and wherein the isolation region has a first portion proximate to the top surface of the substrate and a second portion distal to the top surface of the substrate; and
   a gap in the first doping well between a first part and a second part of the first doping well, the gap comprising an undoped region in the first doping well, wherein the gap is located between the second portion of the isolation region and the bottom surface of the substrate.

2. The device structure according to claim 1, wherein the second doping well comprises a different doping type than the first doping well.

3. The device structure according to claim 1, further comprising:
contacts on top surfaces of the first doping well and the second doping well, respectively, wherein the contacts are electrically connected by wiring such that the first doping well and the second doping well are electrically connected to form a diode.

4. The device structure according to claim 1, further comprising:
a deep doping well in the substrate.

5. The device structure according to claim 4, wherein the deep doping well is attached to the first doping well and comprises the same type of doping as the first doping well.

6. The device structure according to claim 4, wherein the deep doping well is located between the first doping well and the bottom surface of the substrate.

7. The device structure according to claim 4, wherein the deep doping well extends into the undoped moat between the first doping well and the second doping well.

8. The device structure according to claim 1, further comprising:
fins that extend from the first doping well, wherein the fins have a first fin portion proximate to the substrate and a second fin portion distal to the substrate.

9. A diode structure comprising:
a substrate;
a first doping well in the substrate comprising a first doping type, the first doping well having a first part and a second part;
a second doping well in the substrate comprising a second doping type, wherein the second doping well comprises a different doping type than the first doping well;
an undoped moat in the substrate, the undoped moat being between the first doping well and the second doping well;
an isolation region in the substrate, the isolation region being positioned in the first doping well and extending to a surface of the substrate, wherein the isolation region has a first portion proximate to the surface of the substrate and a second portion distal to the surface of the substrate, wherein an undoped gap is located in the first doping well between the first part and the second part, and wherein the undoped gap is positioned between the second portion of the isolation region and a bottom of the substrate;
an anode comprising a relatively increased first doping concentration region in the first doping well; and
a cathode comprising a relatively increased second doping concentration region in the second doping well.

10. The diode structure according to claim 9, further comprising:
contacts on top surfaces of the first doping well and the second doping well, respectively, wherein the contacts are electrically connected by wiring such that the anode and the cathode are electrically connected to form the diode.

11. The diode structure according to claim 9, further comprising:
a deep doping well in the substrate.

12. The diode structure according to claim 11, wherein the deep doping well is attached to the first doping well and comprises the first doping type.

13. The diode structure according to claim 11, wherein the deep doping well is located between the bottom of the first doping well and the bottom of the substrate.

14. The diode structure according to claim 11, wherein the deep doping well extends into the undoped moat between the first doping well and the second doping well.

15. The diode structure according to claim 9,
fins that extend from the first doping well, wherein the fins have a first fin portion proximate to the substrate and a second fin portion distal to the substrate.

16. A device structure comprising:
a substrate having a top surface and a bottom surface opposite the top surface;
a first doping well in the substrate, the first doping well having a top coplanar with the top surface of the substrate and a bottom opposite the top, wherein the first doping well comprises a first type of doping;
fins that extend from the top of the first doping well, wherein the fins have a first fin portion proximate to the substrate and a second fin portion distal to the substrate;
an anode comprising a relatively increased first doping concentration region in the first doping well;
an isolation region in the first doping well, the isolation region having a first portion proximate to the top surface of the substrate and a second portion distal to the top surface of the substrate;
a gap in the first doping well, the gap comprising an undoped region between a first part of the first doping well and a second part of the first doping well;
a deep doping well in the substrate, the deep doping well being attached to the first doping well and comprising the first type of doping, the deep doping well being located between the bottom of the first doping well and the bottom surface of the substrate;
a second doping well in the substrate, wherein the second doping well comprises a second type of doping different from the first type of doping;
an undoped moat in the substrate, the undoped moat being between the first doping well and the second doping well; and
a cathode comprising a relatively increased second doping concentration region in the second doping well.

17. The device structure according to claim 16, further comprising:
contacts on top surfaces of the first doping well and the second doping well, respectively, wherein the contacts are electrically connected by wiring such that the anode and the cathode comprise a diode.

18. The device structure according to claim 16, wherein the deep doping well extends into the undoped moat between the first doping well and the second doping well.

19. The device structure according to claim 16,
a third doping well in the substrate, the third doping well having a top coplanar with the top surface of the substrate and a bottom opposite the top, wherein the third doping well comprises the first type of doping;
a second anode comprising a relatively increased first doping concentration region in the third doping well;
a second isolation region in the third doping well, the second isolation region having a first portion proximate to the top surface of the substrate and a second portion distal to the top surface of the substrate;
a gap in the third doping well, the gap comprising an undoped region between a first part of the third doping well and a second part of the third doping well; and
a second deep doping well in the substrate, the second deep doping well being attached to the third doping well and comprising the first type of doping, the second deep doping well being located between the bottom of the third doping well and the bottom surface of the substrate;

wherein the second doping well is between the first doping well and the third doping well, and a second undoped moat is between the third doping well and the second doping well.

20. The device structure according to claim 19, further comprising contacts on top surfaces of the first doping well, the second doping well, and the third doping well, respectively, wherein the contacts are electrically connected by wiring such that the anode and the cathode are electrically connected to form a first diode and the second anode and the cathode are electrically connected to form a second diode.

* * * * *